/

US012172344B2

(12) United States Patent
Vogler et al.

(10) Patent No.: US 12,172,344 B2
(45) Date of Patent: Dec. 24, 2024

(54) STAMP REPLICATION DEVICE AND METHOD FOR PRODUCING A HOLDING MEANS FOR A STAMP REPLICATION DEVICE AS WELL AS A STAMP

(71) Applicant: SUSS MicroTec Lithography GmbH, Garching (DE)

(72) Inventors: Uwe Vogler, Garching (DE); Fabian Kloiber, Garching (DE); Georg Fink, Garching (DE); Christian May, Garching (DE); Ghazahleh Jalali, Garching (DE)

(73) Assignee: SUSS MICROTEC LITHOGRAPHY GMBH (DE)

( * ) Notice: Subject to any disclaimer, the term of this patent is extended or adjusted under 35 U.S.C. 154(b) by 92 days.

(21) Appl. No.: 16/872,163

(22) Filed: May 11, 2020

(65) Prior Publication Data
US 2020/0353650 A1  Nov. 12, 2020

(30) Foreign Application Priority Data
May 9, 2019  (NL) ..................... 2023097

(51) Int. Cl.
*B29C 33/42* (2006.01)
*B29C 33/30* (2006.01)
(Continued)

(52) U.S. Cl.
CPC ............ *B29C 33/424* (2013.01); *B29C 33/30* (2013.01); *B29C 33/3857* (2013.01);
(Continued)

(58) Field of Classification Search
CPC ... B29C 33/424; B29C 33/30; B29C 33/3857; B29C 35/0805; B29C 2033/426;
(Continued)

(56) References Cited

U.S. PATENT DOCUMENTS 4,623,608 A * 11/1986 Andrevski ............ G03F 7/0007
430/22
5,203,401 A *  4/1993 Hamburgen ......... G01R 1/0458
165/917
(Continued)

FOREIGN PATENT DOCUMENTS

CN   103843127   6/2014   ........... H01L 21/683
EP   0299168     6/1988   ............. B29C 51/42
(Continued)

*Primary Examiner* — Timothy Kennedy
*Assistant Examiner* — Inja Song
(74) *Attorney, Agent, or Firm* — HAYES SOLOWAY P.C.

(57) ABSTRACT

A stamp replication device for producing stamps for the production of at least one of microstructured and nanostructured components has a platform, a cover that is positionable on the platform and a holding device for a stamp carrier, wherein the holding device is provided on the cover or on the platform and includes a carrier as well as a microstructured vacuum surface on the carrier for holding the stamp carrier. In addition, a method for producing a holding device for a stamp replication device as well as a method for producing a stamp are specified.

19 Claims, 5 Drawing Sheets

(51) Int. Cl.
  *B29C 33/38* (2006.01)
  *B29C 35/08* (2006.01)
(52) U.S. Cl.
  CPC .... B29C 35/0805 (2013.01); *B29C 2033/426* (2013.01); *B29C 2035/0827* (2013.01)
(58) Field of Classification Search
  CPC ........ B29C 2035/0827; B29C 33/3842; B29C 59/02; B81C 1/00031; B81C 1/0046; G03F 7/0015; G03F 7/0002; G03F 7/707; H01L 21/0259; H01L 21/6838; B82Y 10/00; B82Y 40/00; B25B 11/005
  See application file for complete search history.

(56) References Cited

U.S. PATENT DOCUMENTS

| | | | | |
|---|---|---|---|---|
| 10,569,449 | B1* | 2/2020 | Curts | B29C 43/003 |
| 2002/0093122 | A1* | 7/2002 | Choi | B29C 43/021 |
| | | | | 264/401 |
| 2004/0104326 | A1* | 6/2004 | Demel | H01L 21/6838 |
| | | | | 248/362 |
| 2004/0141163 | A1 | 7/2004 | Bailey et al. | 355/18 |
| 2004/0163563 | A1* | 8/2004 | Sreenivasan | B29C 43/021 |
| | | | | 101/494 |
| 2005/0266587 | A1* | 12/2005 | Nimmakayala | B82Y 10/00 |
| | | | | 438/5 |
| 2006/0172031 | A1 | 8/2006 | Babbs et al. | B28B 11/08 |
| 2007/0063453 | A1* | 3/2007 | Ishikawa | B24B 37/30 |
| | | | | 279/3 |
| 2007/0138699 | A1* | 6/2007 | Wuister | G03F 7/0002 |
| | | | | 425/375 |
| 2007/0205524 | A1* | 9/2007 | Best | B82Y 10/00 |
| | | | | 264/1.1 |
| 2009/0158947 | A1* | 6/2009 | Thallner | B82Y 40/00 |
| | | | | 430/252 |
| 2009/0179365 | A1* | 7/2009 | Lerner | B25B 11/005 |
| | | | | 269/21 |
| 2010/0007868 | A1 | 1/2010 | Nimmakayala et al. | |
| | | | | G03F 7/62 |
| 2011/0133354 | A1* | 6/2011 | Kimura | G03F 7/0002 |
| | | | | 264/40.5 |
| 2013/0082448 | A1 | 4/2013 | Ferguson | 279/3 |
| 2013/0292865 | A1* | 11/2013 | Yang | B29C 59/026 |
| | | | | 264/293 |
| 2014/0020846 | A1* | 1/2014 | Hirakawa | H01L 21/67092 |
| | | | | 156/752 |
| 2014/0305904 | A1* | 10/2014 | Lan | G03F 7/0002 |
| | | | | 216/41 |
| 2016/0148831 | A1* | 5/2016 | Greer | H01L 22/12 |
| | | | | 269/21 |
| 2018/0117805 | A1 | 5/2018 | Choi | B29C 43/58 |
| 2018/0122681 | A1* | 5/2018 | Ellis | H01L 21/68742 |
| 2019/0317396 | A1* | 10/2019 | Kawasaki | G03F 7/0002 |
| 2021/0125855 | A1* | 4/2021 | Roy | B29C 35/0805 |

FOREIGN PATENT DOCUMENTS

| | | | |
|---|---|---|---|
| EP | 2315077 | 4/2011 | ............... G03F 7/00 |
| JP | H08279549 | 10/1996 | ............. H01L 21/68 |
| JP | 9-63134 | 3/1997 | ............... G11B 7/26 |
| JP | H09283605 | 10/1997 | ............. H01L 21/68 |
| JP | 2013251301 | 12/2013 | ........... H01L 21/027 |
| JP | 201874159 | 5/2018 | ........... H01L 21/027 |
| WO | WO9407179 | 3/1994 | ............... G03B 9/00 |

* cited by examiner

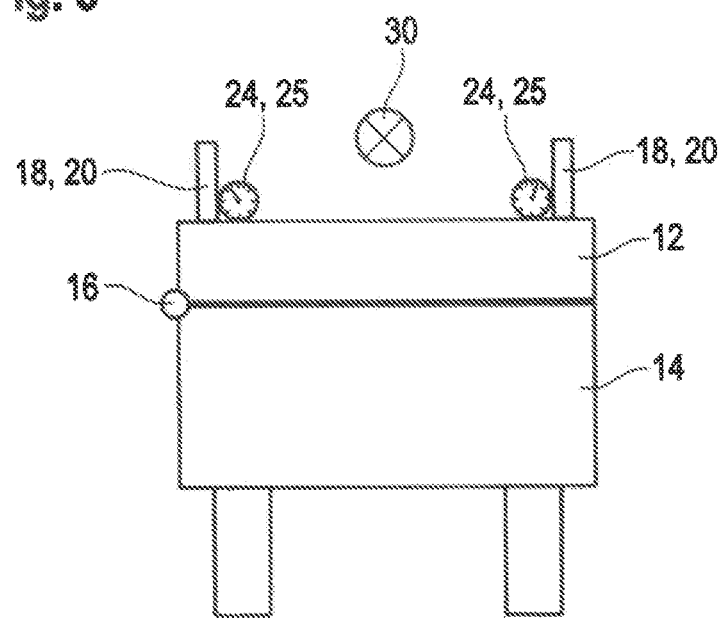
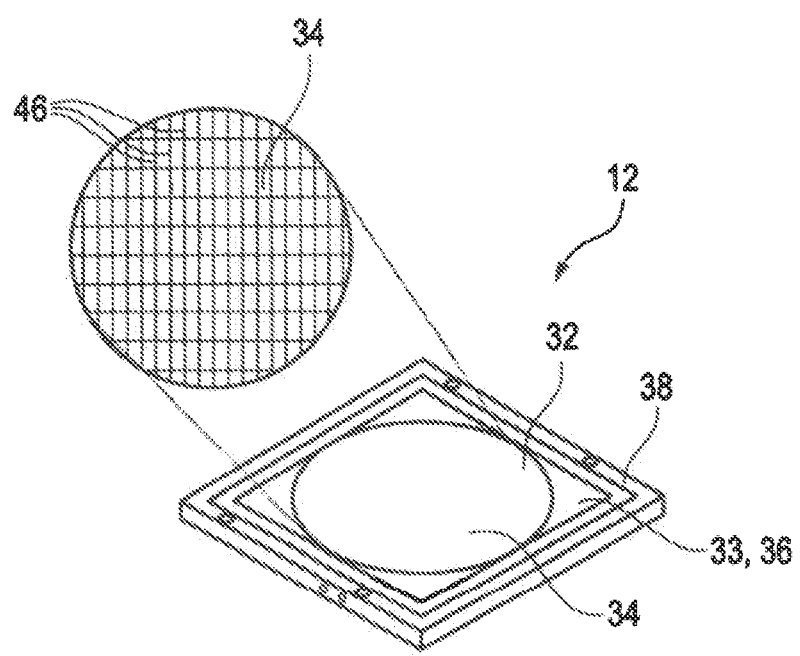

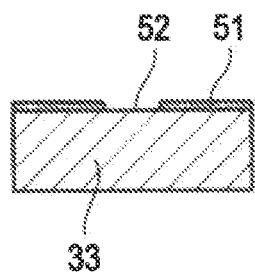 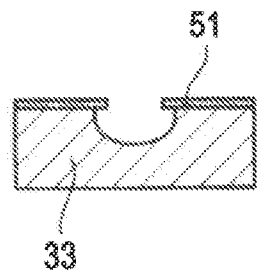 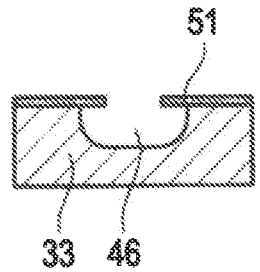
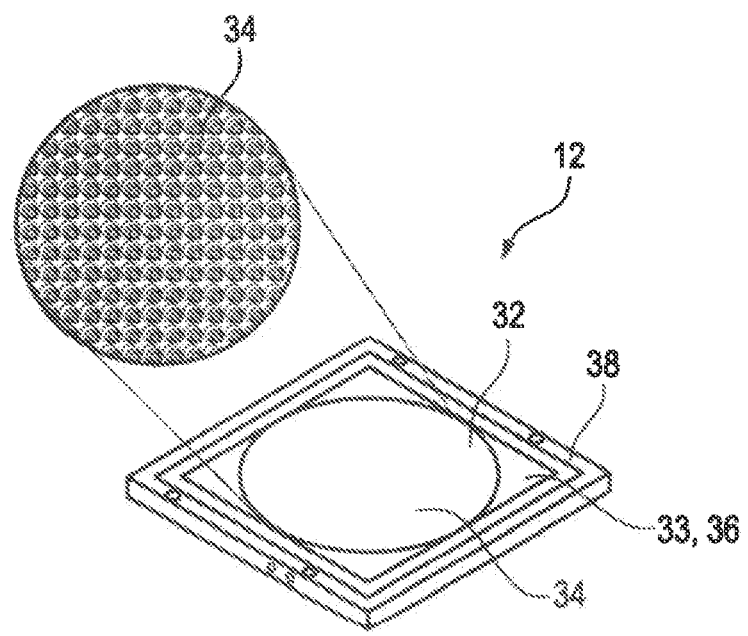

STAMP REPLICATION DEVICE AND METHOD FOR PRODUCING A HOLDING MEANS FOR A STAMP REPLICATION DEVICE AS WELL AS A STAMP

FIELD OF THE DISCLOSURE

The present disclosure relates to a stamp replication device for producing stamps for the production of microstructured and/or nanostructured components and a method for producing a holding means for a replication device as well as a method for producing a stamp for a replication device.

BACKGROUND

In the production of stamps for replication devices, a liquid or viscous stamp material is usually filled into a stamp replication device, given the desired form by means of a molding part and cured.

The curing can be achieved, for example, by heating the stamp replication device. To this end, heated water is led through channels in a cover of the stamp replication device. The stamp must remain in the stamp replication device until it is completely cured which may take a few days to a week. Therefore, it is necessary to use several stamp replication devices simultaneously in order to produce stamps in sufficient quantities. As a result, high acquisition costs are incurred and the space requirement is also increased.

However, the demand for new stamps is relatively high as stamps for producing microstructured and/or nanostructured components have a relatively small service life and only about ten to a hundred stamping processes can be performed with them. This is why there is the desire to reduce the cycle time in stamp production.

Another method of curing the stamp is curing by means of exposure to light, particularly to UV light. Curing can be achieved much more quickly through exposure to light than through heating. However, the desired quality cannot be maintained in the case of stamp production using this method.

The liquid stamp material is placed namely on a stamp carrier and bonded to it during curing. The stamp carrier, for example, of the completely cured stamp is held at least temporarily by means of a vacuum during production. For this purpose, vacuum channels lead from the stamp carrier and run at least in sections along a surface of the stamp carrier.

The problem is that light is scattered and reflected differently on the vacuum channels as on the smooth polished surfaces. This affects the uniformity of the irradiation in the stamp material negatively and results in process variations. In this content, this is referred to as a shadow effect.

SUMMARY

Thus, there is a need to provide stamp replication device which enables the production of stamps within a short time with a consistently high quality. In addition, it is an object of the disclosure to specify a method for producing a holding means for a stamp replication device as well as a method for producing a stamp.

This object is solved according to the disclosure by means of a stamp replication device for producing stamps for the production of microstructured and/or nanostructured components comprising a platform, a cover that is placeable on the platform and a holding means for a stamp carrier, wherein the holding means is provided on the cover or on the platform and comprises a carrier as well as a microstructured vacuum surface on the carrier for holding the stamp carrier.

Within the scope of this disclosure, "microstructured" is understood to mean that the size of structures or unevenness is in the micrometer range or below.

The advantage of a holder comprising a microstructured vacuum surface is that the vacuum structures are so small that they are not reproduced in the production of the stamp and there are therefore no shadow effects.

The stamp replication device according to the disclosure thus enables the curing of stamps by exposure to light without compromising the quality of the stamp produced. The process times in the production of the stamp can be particularly brief by the use of exposure to light which positively impacts the production costs of the stamp.

The cover of the stamp replication device is preferably at least partially transparent to light, in particular UV light, in order to allow the exposure to light of the stamp in the stamp replication device. Alternatively or additionally, the platform can also be at least transparent in some regions.

The carrier comprising the microstructured vacuum surface can also be integrated into the cover, in particular formed in a single piece with the cover. In other words, the vacuum surface may be integrated into the cover directly.

In particular, a molding part that represents the form of the stamp to be produced as a negative is holdable on the cover or on the platform and the holding means is provided on the other one of the cover and the platform. If the cover is located on the platform, the microstructured vacuum surface is preferably facing the molding part. In this state, a mold is formed for example, in which a stamp can be molded.

The cover is preferably mounted pivotably by means of hinges so that the cover can be placed on the platform by pivoting.

The stamp carrier can be a thin film, a glass plate or the like. The molding material, from which the stamp is molded, is distributed on the stamp carrier during production.

Vacuum grooves may also be provided for holding the molding part. However, these do not have to be microstructured.

Typically, the molding part is more likely to be located on the platform as on the cover as the liquid stamp material is applied there. As the cover is pivoted when closing the stamp replication device, the liquid stamp material could namely flow out of the stamp replication device.

According to an embodiment, the individual structures of the microstructured vacuum surface have a feature size of no greater than 50 μm. The maximum feature size is based on, for example, a depth and/or a width of an individual structure. A particularly good uniformity of irradiation can be achieved with such feature sizes.

The microstructured vacuum surface can comprise a statistical structuring. A statistical structuring is produced, for example, through sand blasting, sanding, milling or etching. This means a statistical structuring has a random structure. Such statistically structured surfaces are also referred to as surface diffusers. Such structuring can be produced particularly simply and economically.

Alternatively or additionally, the microstructured vacuum surface can comprise micro-vacuum channels that extend over the surface of the holding means. Micro-vacuum channels have an advantage over statistical structuring as the individual structures can be dimensioned particularly exactly. In particular, only small variations in thickness and depth occur in micro-vacuum channels. Another advantage is that the surface of the microstructured vacuum surface is not affected by the structuring outside, thus between the individual micro-channels, and is particularly smooth.

Micro-vacuum channels can be produced by lithography, a removal method such as wet etching for example, by lasering or by micro-milling. Such methods facilitate particularly precise structuring.

Preferably, the depth and/or the width of the micro-vacuum channels are smaller than 50 µm, in particular smaller than 10 µm. With a such channel size, the stamps can be produced with a particularly high quality.

According to an embodiment, the micro-vacuum channels run radially on the holding means seen in top view. Alternatively or additionally, the micro-vacuum channels can be annular channels, in particular to connect straight micro-vacuum channels.

Alternatively, the micro-vacuum channels can run in a lattice shape on the holding means seen in top view. To this end, the micro-vacuum channels run preferably evenly in two directions. The micro-vacuum channels that cross each other can run orthogonally or at an acute angle to each other.

By means of a micro-vacuum channels which run radially, annularly or in a lattice shape, a vacuum can be applied on the stamp carrier particularly uniformly.

According to an embodiment, the micro-vacuum channels are provided at regular intervals, wherein a web is provided between two micro-vacuum channels in each case, in particular wherein the pitch of the microstructured vacuum surface as the width of one of said micro-vacuum channels and the adjacent web is less than or equal to 50 µm, preferably less than or equal to 10 µm. Together with the adjacent web, the channel forms an individual structure of the microstructuring in each case, whose collective width is termed "pitch". A particularly good uniformity of illumination is achieved by means of such feature sizes.

The width of the micro-vacuum channels is preferably a maximum of 90% of the pitch, in particular exactly 90% of the pitch. A width of the micro-vacuum channels which is as wide as possible is advantageous with regards to the holding force of the vacuum applied to the stamp carrier. A width up to a maximum of 90% ensures a reliable delimitation of individual micro-vacuum channels from each other by means of the web.

The depth of the micro-vacuum channels is for example no greater than ten times the width of the micro-vacuum channels. In this way, a vacuum can be generated along the microstructured vacuum surface uniformly so that a stamp carrier can be supported reliably.

The holding means can comprise a macroscopic vacuum channel, wherein the vacuum surface, in particular the micro-vacuum channels, is fluidly connected to the vacuum channel, in particular wherein the vacuum channel completely surrounds the microstructured vacuum surface. In this way, a vacuum can be generated on the microstructured vacuum surface via the macroscopic vacuum channel. The macroscopic vacuum channel can be connected to a vacuum source for this purpose.

Alternatively, the macroscopic vacuum channel can also selectively supply the microstructured vacuum surface.

Within the scope of the disclosure, a "macroscopic" channel is understood to mean a channel with structures in the micrometer range or above.

The cover of the stamp replication device has, for example, at least a fluid connection for applying the vacuum, in particular wherein the macroscopic vacuum channel extends in the cover from the fluid connection to the holder.

According to an embodiment, the stamp replication device comprises a spacing adjustment device for adjusting the spacing between the cover and the platform and a measuring device for measuring the spacing between the cover and the platform, wherein the spacing adjustment device and the measuring device are provided separately from each other. As a result, an adjustment of the spacing and measurement of the spacing can occur independently of each other. In this way, the spacing between the platform and the cover can be set particularly precisely.

The spacing adjustment device comprises, for example, micrometer screws and the measuring device comprises, for example, dial indicators. When operating the spacing adjustment device, the cover may end up namely inclining. If, for example, several micrometers screws are provided and one of said screws is turned in order to increase the spacing between the cover and the platform, the spacing between the cover and the platform can be reduced at another point. As a result of the separately provided measuring device, such an inclination can be detected and the spacing between the cover and the platform can be readjusted accordingly.

Three support regions are provided on the platform for supporting the cover, in particular wherein one of the support regions limits one degree of freedom, another of the support regions limits two degrees of freedom and/or another of the support regions limits three degrees of freedom. In other words, one of the support regions provides five degrees of freedom, another of the support regions provides four degrees of freedom and a further support region provides three degrees of freedom. In this way, the support of the cover is statically not overdeterminate and clearly defined. The cover is supported thus particularly stably.

A degree of freedom is understood to mean both translational and rotational degrees of freedom.

The micrometers screws have for example a semi-spherical end, each resting on one of the support regions when the cover is closed, said support regions being configured in particular as a point, area or linear support. Preferably, three micrometer screws are provided in total.

According to an embodiment, the holding means, in particular the carrier, is made of glass or quartz, wherein the holding means is transparent to light, in particular UV light, in particular light with a wavelength of 250 nm to 450 nm. Preferably, the holding means is transparent to light with a wavelength of 365 nm. Light with this wavelength is particularly suitable for curing stamps.

The holding means, in particular the carrier, is for example a plate that is installed in particular in the cover. Preferably, the holding means, in particular the carrier, is framed.

The stamp replication device comprises preferably an irradiation source for the purpose of exposing a liquid stamp material to light, in particular UV light, wherein the irradiation source comprises a flood lamp and/or a collimator. The stamp material can be irradiated particularly uniformly by means of such an irradiation source.

The lamps used in the irradiation source are for example LEDs or a mercury vapor lamp.

Furthermore, this object is solved according to the disclosure by a method for producing a holding means for a stamp replication device, in particular a stamp replication device designed as previously described. The method comprises the following steps:

provision of a carrier of the holding means, and
generation of a microstructured vacuum surface by applying a statistical structuring, in particular by means of sand blasting, sanding, milling or etching, and/or by introducing micro-vacuum channels, in particular through the use of a lithographic method, laser method or erosion method.

In particular, a structuring is applied to the microstructured vacuum surface with a feature size of the individual structures of no greater than 50 µm.

In addition, the object is solved according to the disclosure by a method for producing a stamp for a replication device for the production of microstructured and/or nanostructured components in a device as previously described. The method comprises the following steps:

positioning the stamp carrier and a molding part in the stamp replication device, applying a vacuum on the microstructured vacuum surface for the purpose of holding the stamp carrier, applying the liquid stamp material on the molding part or the stamp carrier, positioning the cover on the platform, and curing the stamp material by exposing the stamp material to UV light.

The production time of stamps for a replication device can be reduced by such a method. Moreover, process variations in the production of stamps for replication devices can be reduced by such a method.

The aperture angle of the irradiation or a range of irradiation angles during the exposure of the stamp material is preferably selected in such a way that variations in the irradiance do not occur in the stamp material. An irradiation angle that is as large as possible positively affects the uniformity of the irradiation. For example, the stamp material is irradiated at an angle of up to ±90°.

DESCRIPTION OF THE DRAWINGS

Additional advantages and features of the disclosure can be found in the following description and in the attached drawings to which reference is made. In the drawings:

FIG. 3 shows the stamp replication device from FIGS. 1 and 2 in a closed state, FIG. 4 shows the cover for the stamp replication device, FIGS. 7a to 7c show various steps in the production of a holding means for the stamp replication device, FIG. 8 shows the cover according to a third embodiment of the stamp replication device.

DETAILED DESCRIPTION

Lists having a plurality of alternatives connected by "and/or", for example "A, B and/or C" are to be understood to disclose an arbitrary combination of the alternatives, i.e. the lists are to be read as "A and/or B and/or C". The same holds true for listings with more than two items.

Figure 1:
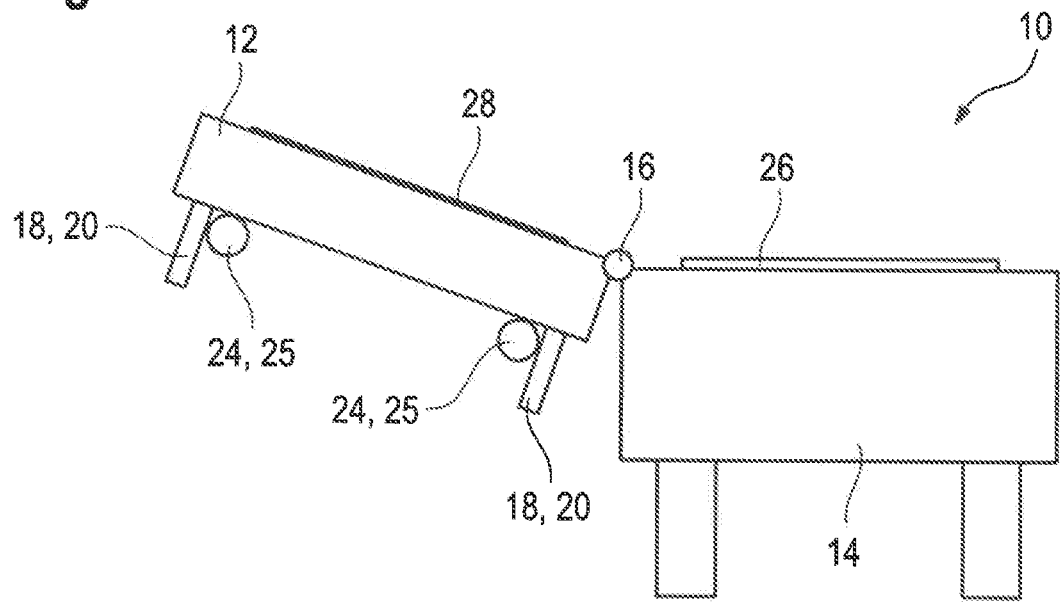
FIG. 1 shows a stamp replication device according to the disclosure schematically.
Figure 2:
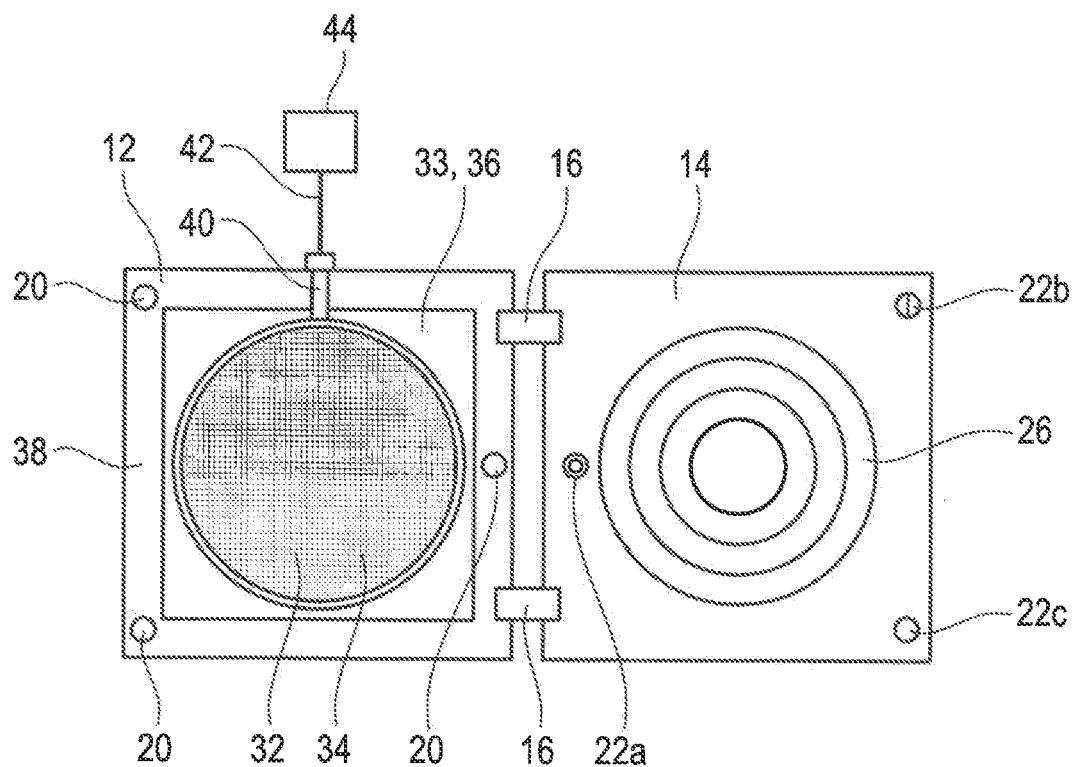
FIG. 2 shows the stamp replication device from FIG. 1 in a top view.

FIGS. 1, 2 and 3 show a stamp replication device 10 for producing stamps for the production of nanostructured and/or microstructured components schematically. The stamp replication device 10 comprises a cover 12 and a platform 14.

The cover is mounted on the platform 14 pivotably by means of hinges 16 and can be placed on the platform 14, as shown in FIG. 3.

The stamp replication device 10 comprises a spacing adjustment device 18 in order to set a defined spacing from the cover 12 to the platform 14 when the stamp replication device 10 is in a closed state. The spacing adjustment device 18 comprises, for example, three micrometer screws 20 that are preferably rounded on their ends which are directed towards the platform 14.

Three support regions 22a, 22b, 22c are provided on the platform 14 for supporting the cover 12 accordingly, in particular in each case one support region 22a, 22b, 22c for one micrometer screw 20. Thus, one of the support regions 22a provides five degrees of freedom, another of the support regions 22b provides four degrees of freedom and a further support region 22c provides three degrees of freedom.

The support regions are illustrated in FIG. 2 by dotted lines. The support region 22a is formed by a conical depression. The support region 22b is formed by a V-shaped depression. The support region 22c is formed by an area.

In addition, the stamp replication device 10 comprises a measuring device 24 for measuring the spacing between the cover 12 and the platform 14. The measuring device 24 is provided separately from the spacing adjustment device 18. Thus, the amendments in the spacing between the cover 12 and the platform 14 can be detected which are not caused by the operation of the spacing adjustment device 18. In this way, the spacing between the cover 12 and the platform 14 can be set particularly precisely.

The measuring device 24 comprises for example at least a dial indicator 25, preferably in each case one dial indicator 25 per micrometer screw 20. Each dial indicator 25 is assigned to one micrometer screw 20, but configured separately from it.

Moreover, the stamp replication device 10 comprises an irradiation source 30 for exposing a liquid stamp material to light, in particular UV light. Such an irradiation source 30 is illustrated in FIG. 3. A stamp material present in the stamp replication device 10 can be cured by exposure to light.

The irradiation source 30 can comprise a flood lamp and/or a collimator for this purpose. A stamp material can be irradiated particularly uniformly using a flood lamp and/or a collimator, which substantially impacts the quality of the finished stamp.

The cover 12 is, for example, at least partially transparent to light, in particular UV light, in order to enable the irradiation of the stamp material.

A molding part 26 employed in the stamp replication device 10 is illustrated in FIGS. 1 and 2. The molding part 26 represents the form of the stamp to be produced as a negative. The molding part 26 can be exchangeable so that different molding parts 26 can be employed for the production of different stamp geometries.

Moreover, a stamp carrier 28 employed in the stamp replication device 10 is illustrated in FIGS. 1 and 2, said stamp carrier 28 being connected to the stamp material permanently during the production of the stamp.

Both the molding part 26 and the stamp carrier 28 are held in place on the platform 14 and the cover 12 by means of a vacuum in the stamp production. This is necessary so that the stamp carrier 28 or the finished stamp do not fall out unintentionally when pivoting the cover 12 into position and so that the molding part 26 remains on the platform 14 when opening the cover 12 and does not remain stuck to the stamp.

In order to hold the stamp carrier in place, the stamp replication device 10 comprises a holding means 32 for holding the stamp carrier 28 that is provided on the cover 12 in the shown embodiment. This is shown in FIG. 2. It is however conceivable that the holding means 32 is located on the platform 14.

The holding means 32 comprises in particular a carrier 33 and a microstructured vacuum surface configured on the carrier 33.

The holding means 32, in particular the carrier 33, is for example a plate 36 that can be installed in the cover 12. Alternatively, the carrier 33 can form the cover 12 or a part of the cover 12.

In the shown embodiment, the carrier 33 is enclosed by frame 38, as can be seen in FIG. 2, wherein the frame 38 and the carrier 33 collectively form the cover 12. The frame 38 is optional, it imparts particularly good stability to the carrier 33 and the cover 12.

The carrier 33 can be made of glass or quartz, as a result of which the holding means 32 is transparent to light, in particular UV light, in particular light with a wavelength of 250 nm to 450 nm.

The holder of the molding part 26 can be carried out in a known manner, in particular also by means of a vacuum. However, no microstructured vacuum surface 34 is necessary for holding the molding part 26 as the holder of the molding part 24 does not or does not appreciably impact the quality of the stamp.

The holding means 32 comprising the microstructured vacuum surface 34 is shown in a top view in FIG. 2. The vacuum surface 34 has, for example, the contour of the stamp carrier 28 so that the stamp carrier 28 completely covers the vacuum surface 34 if it is employed in the stamp replication device 10 as intended. The stamp carrier 28 is not shown in FIG. 2 in order to facilitate a view of the microstructured vacuum surface 34.

The individual structures of the microstructured vacuum surface 34 have, for example, a feature size of no greater than 50 µm, preferably no greater than 10 µm.

The holding means 32 comprises a macroscopic vacuum channel 40 in order to generate the vacuum on the microstructured vacuum surface 34. This macroscopic vacuum channel 40 is fluidly connected to the microstructured vacuum surface 34. In the shown embodiment, the macroscopic vacuum channel 40 completely surrounds the microstructured vacuum surface 34. It is however conceivable that the microstructured vacuum surface 34 is only connected to the macroscopic vacuum channel 40 at certain points.

The macroscopic vacuum channel 40 is connected to a vacuum source 44 of the stamp replication device 10 via a channel 42.

A cover 12 comprising a holding means 32 according to the first embodiment is shown in FIG. 4. For better illustrative purposes, a subregion of the microstructured vacuum surface 34 formed on the carrier 33 is shown enlarged.

The microstructured vacuum surface 34 shown in FIG. 4 comprises a multitude of micro-vacuum channels 46 that extend over the surface of the holding means 32, in particular over the surface of the carrier 33.

In a top view on the holding means 32, the micro-vacuum channels 46 run in a lattice shape, wherein the micro-vacuum channels 46 are arranged at regular intervals to each other.

Figure 5:
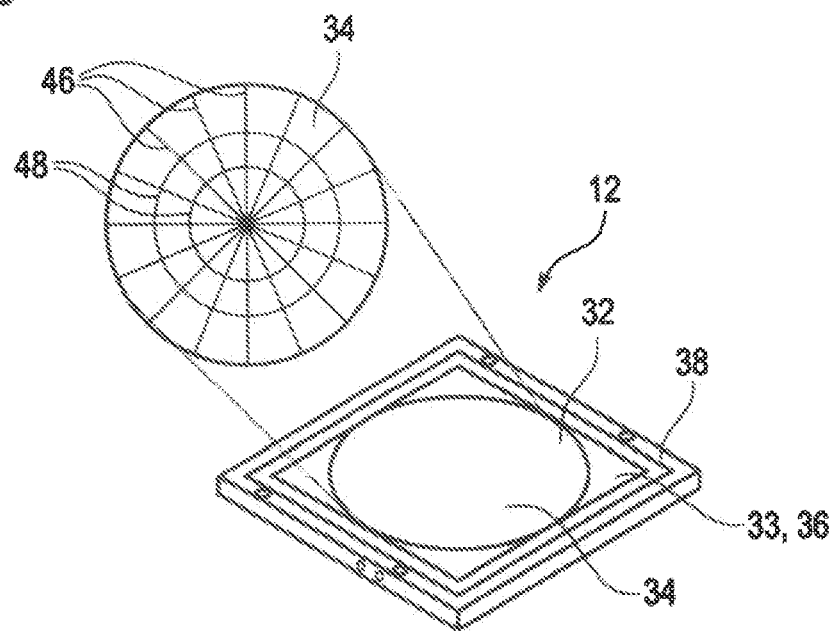
FIG. 5 shows the cover according to a second embodiment of the stamp replication device.

In FIG. 5, a cover 12 comprising a holding means 32 according to the second embodiment is illustrated.

The microstructured vacuum surface 34 shown in FIG. 5 comprises a multitude of micro-vacuum channels 46. In contrast to the microstructured vacuum surface 34 shown in FIG. 4, the micro-vacuum channels 46 according to this embodiment run radially on the holding means 32.

In addition, several annular micro-vacuum channels 48 are present which interconnect the radial micro-vacuum channels 46.

Figure 6:
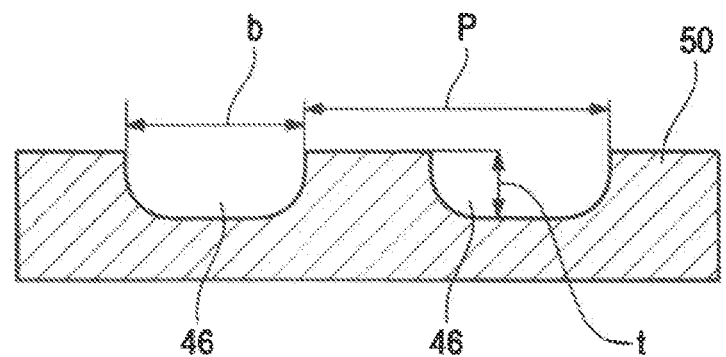
FIG. 6 shows a section through the holding means for a stamp replication device comprising micro-vacuum channels.

In FIG. 6, the dimensions of the micro-vacuum channels 46 are illustrated by means of a section through the holding means 32 from FIG. 4. The section view is extremely enlarged and not true to scale in order to improve the visibility of the micro-vacuum channels 46.

Preferably, the depth t and/or the width b of the micro-vacuum channels 46 are in each case smaller than 50 µm, in particular smaller than 10 µm.

A web 50 is provided in each case between two micro-vacuum channels 46, in particular wherein the pitch p of the microstructured vacuum surface 34 as the combined width b of one of the micro-vacuum channels 46 and the adjacent web 50 is smaller than or equal to 50 µm, preferably smaller than or equal to 10 µm.

To this end, the width b of the micro-vacuum channels 46 is a maximum of 90% of the pitch.

The depth t of the micro-vacuum channels 46 is no greater than ten times the width b of the micro-vacuum channels 46. In the shown embodiment, the depth t amounts to about one third of the width b.

The dimensions of the micro-vacuum channels 46 in the case of radial configuration can be accordingly as large as in the case of a lattice configuration except for the pitch. The pitch is not constant in the case of radial layout, but rather increases from the center of the micro-structured vacuum surface 34 towards the edge.

A possible method for producing a holding means 32 for stamp replication device 10 is shown in the FIGS. 7a to 7c, in particular a holding means 32 according to FIGS. 4 and 5. More specifically, the production of micro-vacuum channels 46 on a carrier 33 of the holding means 32 is shown. For simplicity, only a small section of the carrier 33 is shown in the FIGS. 7a to 7c.

Initially, a carrier 33 of the holding means 32 is provided, in particular a carrier 33 without a microstructured vacuum surface 34.

Subsequently, the microstructured vacuum surface 34 is created through the introduction of micro-vacuum channels 46. This can be carried out by a lithographic method, a laser method or an erosion method.

A lithographic method is shown in the FIGS. 7a to 7c exemplarily. To this end, a mask 51 is initially positioned on the carrier 33, as shown in FIG. 7a.

Then, the surface 52 of the carrier 33 not covered by the mask 51 is exposed to an etching medium. As a result, the material of the carrier 33 is removed to a certain extent, thereby forming the micro-vacuum channels 46, as shown in the FIGS. 7b and 7c.

In FIG. 8, a cover 12 comprising a holding means 32 according to a third embodiment is illustrated.

In the embodiment shown in FIG. 8, the microstructured vacuum surface 34 comprises a statistical structuring, in particular a random structure. Even the statistical structuring only has structures in the micrometer range, in particular smaller than 50 µm.

Figure 9:
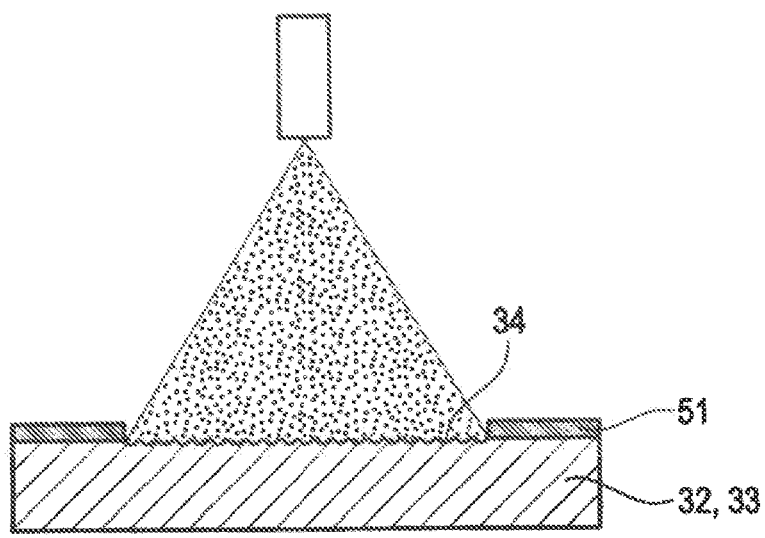
FIG. 9 shows the production of a holding means according to the third embodiment.

A method for producing such a holding means 32 for a stamp replication device 10 is shown in FIG. 9.

Even in this case, the carrier 33 of the holding means 32 is initially provided without a microstructured vacuum surface 34.

Subsequently, the microstructured vacuum surface 34 is generated by applying a statistical structuring. This can be carried out by means of sand blasting, sanding, milling or etching.

In FIG. 9, the structuring is shown by means of sand blasting exemplarily. To this end, a region that is not to be structured is covered by a mask 51.

In the following, a method is explained for producing a stamp for a replication device for the production of microstructured and/or nanostructured components in a stamp replication device 10 according to the FIGS. 1 to 3.

Initially, a stamp carrier 28 and a molding part 26 are positioned in the stamp replication device 10. The molding part 26 is positioned on the platform 14 and the stamp carrier 28 is positioned on the cover 12 in the stamp replication device 10 shown in FIGS. 1 to 3.

Subsequently, a vacuum is applied to the microstructured vacuum surface 34 for the purpose of holding the stamp carrier 28.

Before, during or after applying the vacuum, a liquid stamp material is applied to the molding part 26 or the stamp carrier 28. The stamp material is, for example, polydimethylsiloxane (PDMS), in particular s-PDMS or x-PDMS or Sylgard 184.

Afterwards, the cover 12 is positioned on the platform 14, in particular as a result of pivoting it into position. When the cover 12 is positioned on the platform 14, the liquid stamp material is distributed on the molding part 26, for example, through the weight of the cover 12, wherein the form of the molding part 26 is reproduced in the stamp material.

A fastening of the cover 12 is not necessary as the cover 12 is held in position by its own weight in the closed state of the stamp replication device 10.

Subsequently, the stamp material is cured by exposing the stamp material to UV light. The length of the curing is, for example, one to two minutes.

To this end, light emitted from the irradiation source 30 is broken and/or scattered in such a way on the microstructured vacuum surface 34 that the uniformity of the irradiation when exposing the stamp material is not affected negatively. In this way, stamps can be produced with a consistently high quality. In particular, what is referred to as the shadow effect can be avoided.

In contrast to previously conventional vacuum channels, a particularly uniform exposure of the stamp material can occur.

The irradiation angle in the exposure of the stamp material can thus be chosen depending on the pitch p of the microstructured vacuum area 34.

After the curing, the stamp material and the stamp carrier 28 are connected permanently to each other.

A stamp produced by means of a stamp replication device 10 as previously described has, for example, a thickness of 100 μm to 1 mm.

The invention claimed is:

1. A stamp replication device for producing stamps for the production of at least one of microstructured and nanostructured components, comprising a platform, a cover that is positionable on the platform, a holding device for a stamp carrier, a stamp material, and an irradiation source configured to cure the stamp material by exposing the stamp material to light;

wherein the holding device is provided on the cover or on the platform and comprises a carrier as well as a microstructured vacuum surface on the carrier for holding the stamp carrier, wherein the carrier as well as the microstructured vacuum surface are transparent to the light, which is irradiated from the irradiation source, wherein the microstructured vacuum surface is separate from the stamp carrier and comprises micro-vacuum channels that extend over a surface of the holding device, wherein the microstructured vacuum surface and consequently the micro-vacuum channels of the microstructured vacuum surface are provided exclusively on a surface of the carrier, wherein a width of the micro-vacuum channels is smaller than 50 μm, wherein the stamp replication device is configured so that the light emitted from the irradiation source for curing the stamp material passes through the micro-vacuum channels of the microstructured vacuum surface and thereafter on the stamp material, and wherein the light emitted from the irradiation source for curing the stamp material is at least one of broken and scattered in such a way on the micro-vacuum channels of the microstructured vacuum surface that the uniformity of the irradiation is not affected negatively by the micro-vacuum channels of the microstructured vacuum surface, and the micro-vacuum channels of the microstructured vacuum surface are not reproduced on the stamp material.

2. The stamp replication device according to claim 1, wherein individual structures of the microstructured vacuum surface have a feature size of no greater than 50 μm.

3. The stamp replication device according to claim 1, wherein the microstructured vacuum surface has a random structuring.

4. The stamp replication device according to claim 1, wherein a depth of the micro-vacuum channels is smaller than 50 μm.

5. The stamp replication device according to claim 1, wherein the micro-vacuum channels run radially on the holding device seen in top view.

6. The stamp replication device according to claim 1, wherein the micro-vacuum channels run in a lattice shape on the holding device seen in top view.

7. The stamp replication device according to claim 1, wherein the micro-vacuum channels are provided at regular intervals, wherein a web is provided between two micro-vacuum channels in each case.

8. The stamp replication device according to claim 7, wherein a pitch of the microstructured vacuum surface being the width of one of said micro-vacuum channels and the adjacent web is less than or equal to 50 μm.

9. The stamp replication device according to claim 7, wherein a width of the micro-vacuum channels is up to or exactly 90% of the pitch.

10. The stamp replication device according to claim 1, wherein a depth of the micro-vacuum channels is no greater than ten times the width of the micro-vacuum channels.

11. The stamp replication device according to claim 1, wherein the holding device comprises a macroscopic vacuum channel, wherein the vacuum surface is fluidly connected to the vacuum channel.

12. The stamp replication device according to claim 1, wherein the holding device comprises a macroscopic vacuum channel, wherein the vacuum channel completely surrounds the microstructured vacuum surface.

13. The stamp replication device according to claim 1, wherein the stamp replication device comprises a spacing adjustment device for adjusting the spacing between the cover and the platform and a measuring device for measuring the spacing between the cover and the platform, wherein the spacing adjustment device and the measuring device are provided separately from each other.

14. The stamp replication device according to claim 1, wherein three support regions are provided on the platform for supporting the cover, wherein one of the support regions provides five degrees of freedom, another of the support regions provides four degrees of freedom, and still another of the support regions provides three degrees of freedom.

15. The stamp replication device according to claim 1, wherein the holding device is made of glass or quartz, wherein the holding device is transparent to light.

16. The stamp replication device according to claim 1, wherein the holding device is a plate that is installed in the cover.

17. The stamp replication device according to claim 1, wherein the irradiation source comprises at least one of a flood lamp and a collimator.

18. A stamp replication device for producing stamps for the production of at least one of microstructured and nanostructured components, comprising a platform, a cover that is positionable on the platform, a holding device for a stamp carrier, a stamp material, and an irradiation source configured to cure the stamp material by exposing the stamp material to light;
wherein the holding device is provided on the cover and comprises a carrier as well as a microstructured vacuum surface on the carrier for holding the stamp carrier,
wherein the carrier as well as the microstructured vacuum surface are transparent to the light, which is irradiated from the irradiation source,
wherein the microstructured vacuum surface is separate from the stamp carrier and comprises micro-vacuum channels that extend over a surface of the holding device,
wherein the microstructured vacuum surface and consequently the micro-vacuum channels of the microstructured vacuum surface are provided exclusively on a surface of the carrier, wherein a width of the micro-vacuum channels is smaller than 50 μm
wherein the stamp replication device is configured so that the light emitted from the irradiation source for curing the stamp material passes through the micro-vacuum channels of the microstructured vacuum surface and thereafter on the stamp material, and wherein the light emitted from the irradiation source for curing the stamp material is at least one of broken and scattered in such a way on the micro-vacuum channels of the microstructured vacuum surface that the uniformity of the irradiation is not affected negatively by the micro-vacuum channels of the microstructured vacuum surface, and the micro-vacuum channels of the microstructured vacuum surface are not reproduced on the stamp material.

19. A stamp replication device for producing stamps for the production of at least one of microstructured and nanostructured components, comprising a platform, a cover that is positionable on the platform, a holding device for a stamp carrier, a stamp material, and an irradiation source configured to cure the stamp material by exposing the stamp material to light;
wherein the holding device is provided on the cover and comprises a carrier as well as a microstructured vacuum surface on the carrier for holding the stamp carrier, wherein the carrier as well as the microstructured vacuum surface are transparent to the light, which is irradiated from the irradiation source,
wherein the microstructured vacuum surface is separate from the stamp carrier and comprises micro-vacuum channels that extend over a surface of the holding device,
wherein the microstructured vacuum surface and consequently the micro-vacuum channels of the microstructured vacuum surface are provided exclusively on a surface of the carrier, wherein a depth and a width of the micro-vacuum channels is smaller than 50 μm,
wherein the stamp replication device is configured so that the light emitted from the irradiation source for curing the stamp material passes through the micro-vacuum channels of the microstructured vacuum surface and thereafter on the stamp material, and wherein the light emitted from the irradiation source for curing the stamp material is at least one of broken and scattered in such a way on the micro-vacuum channels of the microstructured vacuum surface that the uniformity of the irradiation is not affected negatively by the micro-vacuum channels of the microstructured vacuum surface, and the micro-vacuum channels of the microstructured vacuum surface are not reproduced on the stamp material.

\* \* \* \* \*